March 5, 1957

C. S. FULLER

METHOD OF FABRICATING SEMICONDUCTOR BODIES FOR TRANSLATING DEVICES

Filed Nov. 20, 1952

2,784,121

INVENTOR
C. S. FULLER
BY

ATTORNEY 2,784,121

METHOD OF FABRICATING SEMICONDUCTOR BODIES FOR TRANSLATING DEVICES

Calvin S. Fuller, Chatham, N. J., assignor to Bell Telephone Laboratories, Incorporated, New York, N. Y., a corporation of New York Application November 20, 1952, Serial No. 321,603

5 Claims. (Cl. 148—1.5)

Figure 1:
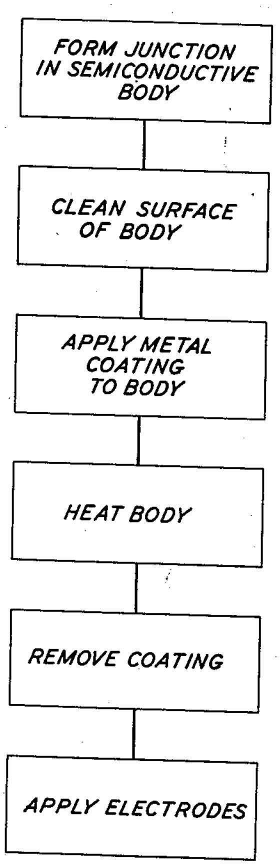

This invention relates to methods of fabricating semiconductor bodies for signal translating devices and more particularly of such bodies including contiguous zones defining one or more rectifying junctions.

Semiconductor bodies, for example of germanium or silicon, containing asymmetric junctions find application in a variety of translating devices such as rectifiers, photocells and transistors. Illustrative devices are disclosed in Patents 2,602,211, granted July 8, 1952, to J. H. Scaff and H. C. Theuerer, and 2,569,347, granted September 25, 1951, to W. Shockley. The junction defining zones in the bodies, as is now known in the art, may be produced by heating a body of one conductivity type in the pesence of or in contact with an impurity characteristic of the opposite conductivity type to effect diffusion of the impurity into a zone or zones of the body and produce an inversion in conductivity type. For example, P zones in an N type body may be produced by diffusing an acceptor material such as indium into the body; N zones may be produced by diffusing a donor material such as antimony into a P type body. The boundary between the bulk of the body and the zone into which sufficient impurity diffuses to effect an inversion in the donor-acceptor ratio constitutes a rectifying junction. Junctions may be produced also by addition of appropriate impurities to a melt during the drawing of semiconductor crystals as disclosed in the application Serial No. 168,184, filed June 15, 1950, of G. K. Teal, now Patent 2,727,840, issued December 20, 1955.

The performance characteristics of translating devices including PN junctions are dependent markedly upon the character of the junctions. Notable among such characteristics are the reverse current in rectifiers, the light sensitivity in photocells and the current multiplication factor in transistors. Another parameter of particular moment, especially from the standpoint of frequency range of response, is the carrier lifetime for the semiconductive material. Resistivity is likewise of importance to the characteristics above noted and is dependent upon the concentration of impurities in the germanium.

One general object of this invention is to improve semiconductor bodies for signal translating devices and particularly such bodies including PN junctions formed by techniques involving heat treatment.

More specific objects of this invention are to increase the carrier lifetimes in semiconductive bodies, decrease the reverse saturation current in junction type rectifiers, increase the response of semiconductor photocells and enhance the current multiplication factor in transistors of the junction type.

In accordance with one feature of this invention, a semiconductive body having one or more PN junctions therein is subjected to a controlled heat treatment to effect marked improvement in the properties thereof of moment in signal translating devices employing the body. More specifically, in accordance with one feature of this invention, such body is coated with a metal or alloy, essentially free of copper, having the property of alloying with the semiconductor below its melting point and having low solubility or low rate of diffusion into the semiconductor, and the body is then heated at a prescribed temperature and for a prescribed time. In one typical case, wherein the semiconductor is germanium, the body is coated with gold and heated at a temperature of about 700° C.

Figure 2:
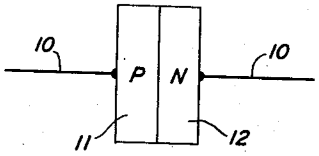
Figure 3:
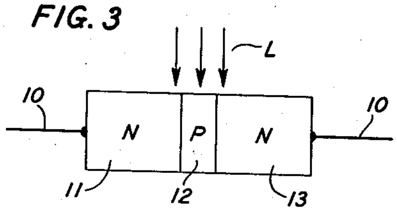
Figure 4:
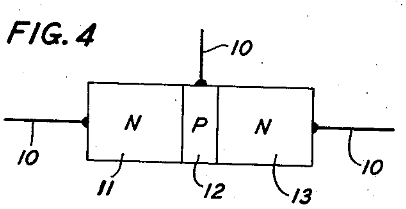
Figure 5:
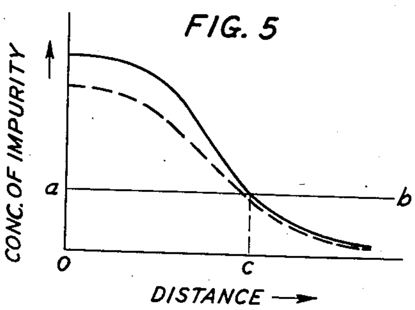
Figure 6:
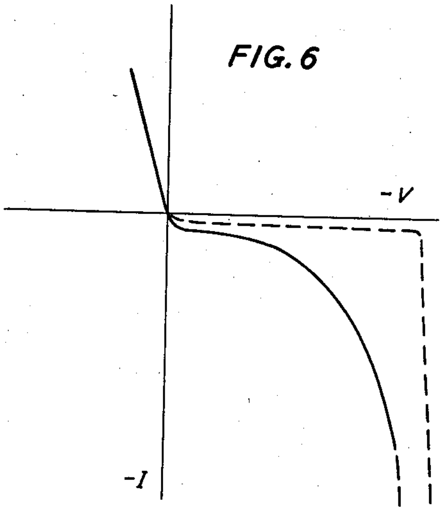

The invention and the above noted and other features thereof will be understood more clearly and fully from the following detailed description with reference to the accompanying drawing in which:

Fig. 1 is a chart indicating the principal steps in the fabrication of semiconductor bodies in accordance with the methods of the invention;

Figs. 2, 3 and 4 portray respectively, a rectifier, a photocell and a transistor including semiconductive bodies constructed in accordance with this invention; and Figs. 5 and 6 are graphs representing certain relationships, discussed hereinafter, in semiconductive bodies.

As represented in Fig. 1, in the methods of this invention a PN junction is formed in a semiconductive body. This may be effected by diffusing an acceptor impurity into an N conductivity type body or a donor impurity into a P conductivity type body, in ways known in the art. Typical acceptors for germanium and silicon are boron, aluminum, gallium and indium; typical donor impurities are arsenic, antimony and phosphorus. The diffusion is controlled to effect an inversion in conductivity type of a portion of the body, that is from N to P type when acceptors are diffused into an N type body, and from P to N type when donors are diffused into a P type body. As is known, the significant impurity may be diffused into the body from one surface to form a single PN junction or from two surfaces to form a pair of junctions.

Following the forming of the junction or junctions, all surfaces of the semiconductive body are cleaned thoroughly. This may be done by etching with a mixture of pure nitric and hydrofluoric acids followed by rinsing with pure water or by abrasion with a grit blast. In both cases, care should be exercised to prevent deposit upon any surface of contaminating impurities which are known to diffuse readily into the semiconductor. Notable among such impurities in the case of germanium is copper, the diffusion of even of the order of 0.001 percent of which, it is known, will deleteriously affect the resistivity and carrier lifetimes. This step of cleaning may be omitted if it is known that the body with the junction therein is free of contaminants.

The clean body then is coated on all surfaces with a metal or alloy of particular character described hereinafter. The coating may be applied as by dipping the semiconductor in a molten bath of the metal or alloy, by electroplating or by thermal deposition. A general requirement for such metal or alloy is that it form an alloy with the semiconductor below the melting point of the latter and that it have a low solubility or a low rate of diffusion into the semiconductor. For cases where the semiconductor is germanium, a specific requirement for the coating material is that it have a diffusion constant in germanium of less than $10^{-8}$ cm.$^2$ per second at temperatures between 800 and 900° C. Metals which have been found particularly suitable in the case of germanium are antimony, gold, silver, tin and zinc, all free of copper.

The coated semiconductive body then is heated at a temperature and time which, in the case of a junction made by diffusion, must be chosen such as not to cause significant rediffusion and change in the concentration gradient perpendicular to the junction. The time and temperature are also dependent upon the volume of the semiconductive body. For germanium bodies, the temperature may be between 450° C. and 900° C. and the time of the heat treatment may be twenty-four hours at the lowest temperature to a few minutes or less at the highest temperature. Specific examples will indicate the general relationships. For the case of a PN junction formed in germanium by diffusion of zinc into an N type body of one or a few millimeters thick, substantial improvements in performance are realized by heat treatment at about 700° C. for three quarters of an hour. In the case of a germanium PN junction formed 5 mils deep by diffusion of arsenic into a P type body at 850° C. for seventeen hours, (diffusivity of arsenic at 850° C.$=7.5\times10^{-11}$ cm.$^2$/sec.), the body being one or a few millimeters thick, substantial improvements are realized by heat treatment at 900° C. for sixteen hours employing a gold coating approximately 0.1 mil thick. In the case of a germanium PN junction formed by diffusing antimony (diffusivity of antimony is substantially the same as arsenic), substantial improvements are obtained by heating at about 750° C. for a few minutes in contact with a similar gold surface layer.

It may be noted that, in general, the magnitude of the improvement especially at the lower temperatures increases with the time of the heat treatment. The relationships will be appreciated from specific examples given hereinafter.

Following the heat treatment, the coating material is removed, for example by etching in a mixture of 4.5 parts by volume each of concentrated nitric and hydrofluoric acids to 1 part of water, until the gold alloy layer is just removed, and electrodes are applied in known ways to desired portions of the body. For example, in the case of a rectifier such as portrayed in Fig. 2, ohmic connections are made to the P and N zones 11 and 12 respectively by wires 10 soldered to these zones. Similar connections may be made to the N zones 11 and 13 of a photocell of NPN configuration such as depicted in Fig. 3. In operation of the cell, light as indicated by the arrows L is directed against the body in the vicinity of the PN junctions therein. In the transistor illustrated in Fig. 4, ohmic connections are made to both N zones 11 and 13 and the intermediate, P, zone 12.

The general results of heat treatment of the coated semiconductor bodies as reflected in the performance characteristics of translating devices including such bodies are reduction in reverse currents and improved Zener characteristics of rectifiers, increase in the light response of photocells, enhanced current multiplication factor in transistors and increases in the carrier lifetimes and resistivity.

Although the invention is not to be limited thereby, the following explanation is consonant with the results observed. The performance characteristics are dependent upon contaminating impurities present in the semiconductive material. It is known that the lifetime is lowered as the concentration of these impurities is increased. For example, it has been established that copper present in germanium even in concentrations as low as 0.0001 atomic percent deleteriously affects the carrier lifetimes. As a result of the heat treatment, some of these contaminating impurities diffuse outwardly and dissolve in the metal coating. For example, in the case of germanium known to contain 0.0001 atomic percent copper, the carrier lifetime is approximately 1 microsecond; after heat treatment in accordance with this invention, the copper content may be reduced to 0.000001 atomic percent and the carrier lifetime is then about eighty to one hundred microseconds. Other contaminating impurities behave similarly.

The enhancement of the current multiplication factor in transistors can be attributed directly to the increased lifetime for minority carriers. Similarly, the improvement in response characteristics of rectifiers and photocells can be attributed to the increased carrier lifetimes both in the interior and at the surface. For example, in rectifiers although the removal of contaminating impurities may alter the resistivity in a way to affect the saturation current unfavorably in the interior, the increase in carrier lifetime more than counterbalances such effect. Further, the increased resistivity produced at the surfaces intersecting the PN junction will provide higher Zener voltages in the neighborhood of the surface and therefore higher Zener breakdown voltage for the device itself. Similarly the increased response to light of PN junctions treated in accordance with this invention is believed to be due to partial removal both of fast diffusing impurities from the interior and surface of the semiconductor and to the partial removal of slower diffusing impurities at and near the surface thus providing higher carrier lifetime.

A possible explanation of the improvements, at least in part, noted after application of the process herein is as follows: In Fig. 5 let the full curve represent the change of concentration of a donor or acceptor with distance measured from the semiconductor surface. Let *ab* be the impurity level of the doping element (acceptor or donor). Then the intersection *c* represents the position of the PN boundary, its distance from the surface being *oc*. The plane of the paper represents a perpendicular cross section through the PN boundary. It is evident that at this surface, as well as others cutting the PN boundary in similar fashion, leakage may be expected to occur when potentials are applied to the N and P sides such as to bias the junction in the reverse direction. This leakage will act as a shunting path thus leading to a reverse characteristic which increases rapidly with reverse applied voltage. This is typical of many diffusion junctions in particular and is illustrated in Fig. 6, full curve. The characteristic after treatment is represented by the dotted curve.

As noted, the full curve in Fig. 5 represents the concentration gradient in the interior and at the surface before treatment. However, after treatment in accordance with the invention this gradient no longer pertains to the semiconductor material near the surface because impurities have been diffused outward. It is indicated by the dotted curve, Fig. 5 if the doping impurity has low diffusion constant compared to the purposely varied impurity only the latter may be considered to be affected by the treatment. This is the case when gallium for example is the doping element (D at 850° C.$<10^{-12}$ cm.$^2$/sec.)

and arsenic is the variable impurity (D at 850° C.$=7.5\times10^{-11}$ cm.$^2$/sec.)

Under these circumstances the gradient after treatment is altered in the semiconducting material near the surface to that shown by the dashed curve in Fig. 5. Since this curve has a less steep slope, the Zener breakdown at the surface will be raised with respect to that in the interior so that the surface no longer appears as easy a shunt path. The reduction in impurity content at the surface will likewise affect an improvement in the lifetime near the surface. This in turn will favor a lower saturation current and an enhanced effect of illumination.

It is evident that conditions may be set up where the choice of donor and acceptor will provide other results. For example, both the variable and the doping impurity levels may be affected by the treatment. Also the temperature and time of treatment as well as the nature of the surface coatings themselves can have different effects upon the semiconductive properties near the surface. Finally, it is evident that the degree of the final etching of the surface layers of the treated semiconductor is important in controlling the concentration gradient near the surface and hence, the electrical properties in the final choice.

Some specific examples will indicate the nature and magnitude of the improvement in performance characteristics of signal translating devices, attainable by fabrication of the semiconductive bodies in accordance with this invention. In one, a junction rectifier such as depicted in Fig. 2 was formed by applying a coating of antimony to one surface of a wafer of P conductivity type germanium and the unit was heated four and one-half hours at 850° C. in helium to effect diffusion of the antimony into a surface portion of the wafer whereby a PN junction was produced. The reverse characteristics of the junction were measured. Then the surfaces of the wafer were cleaned thoroughly by etching, the wafer was coated on all surfaces with gold and the assembly heated at 750° C. for two minutes. Thereafter, the gold coating was removed and the reverse characteristics again measured. The data for these measurements are given below:

| Voltage | Reverse Current in ma. | |
|---|---|---|
| | Initial | After Heat Treatment |
| −5 | 0.02 | 0.01 |
| −10 | 0.02 | 0.01 |
| −15 | 0.10 | 0.03 |
| −20 | 0.35 | 0.15 |
| −23 | 1.00 | 0.35 |

In addition to the marked reduction in reverse current indicated by these data, it was found also that the Zener characteristic was improved by the heat treatment, specifically that whereas in the initial device the Zener point was rounded, after the heat treatment the point was sharp.

In another example, a junction diode was formed by diffusing arsenic into a P type germanium wafer. Subsequently, the wafer was gold plated and the unit heated at 760° C. for four minutes in helium. The original diode exhibited a reverse current of 0.15 ma. at −30 volts; after the gold plating and heat treatment, the reverse current at −30 volts was but 0.01 ma., a decrease by a factor of fifteen.

In another example, a germanium wafer of NPN configuration, such as illustrated in Fig. 3, was formed by diffusing arsenic into P type germanium at 800° C. in helium. The P layer was 8 mils thick and 0.16 cm.$^2$ in cross sectional area. For one volt applied between the N zones, the total dark current was 0.20 ma. and the current for the body illuminated from a 100 watt lamp ten inches from a major face was 0.40 ma. After gold plating and heat treatment at 750° C. for four minutes in helium, the dark current was 0.15 ma. and the illuminated current 0.50 ma. Replating with gold and heating for six minutes at 600° C. in helium resulted in a decrease in the dark current to 0.10 ma. After a third gold plating and heating at 500° C. for one hour in helium, the dark current was 0.02 ma. and the illuminated current was 0.80 ma. Thus, the treatment in accordance with this invention effected an overall decrease in dark current by a factor of 10 and an increase in the effect of the illumination by a factor of twenty.

In still another example, a specimen was constructed and prepared in the same manner as in the next preceding example and a connection was made to the P zone in the manner depicted in Fig. 3. The unit was operated as a grounded base transistor. For a collector voltage of −2.0 volts, the current multiplication factor, $\alpha$, for the transistor before the gold plating and heat treatment was less than 0.4. After the heat treatment, this factor was 0.67.

In another example, arsenic was diffused at 880° C. for seventeen hours into germanium of 10 ohm cm. P type and a PN junction diode cut out. An average saturation current of 27 ma./cm.$^2$ was observed with an increase of current on illumination by a 100-watt bulb at 10 inch distance of 30 percent at 5 volts. After treatment overnight (16 hours) with a gold layer at 500° C. the saturation current was reduced to 3.4 ma./cm.$^2$ and the light effect increased by 500 to 1000 percent.

In another example, the same diffusion junction as in the example above was employed except that it was treated in contact with molten antimony at 660° C. for forty-five minutes in helium. The dark saturation current at 5 volts in one case decreased from 0.50 ma. to 0.08 ma. for 0.02 cm.$^2$ area. The light effect (conditions as above) increased from 20 percent to 250 percent.

As a further example, a piece of germanium doped with gallium to render it P type of 17 ohm cm. resistivity was diffused with arsenic at 800° C. for sixty-four hours to provide an N layer approximately 14 mils deep. Three diodes were cut from this PN junction and measured after the usual etching procedure. After electroplating with a layer of gold approximately 0.05 mil thick, the diodes were heated in helium for three minutes at 800° C., followed by ten minutes at 700° C. in turn followed by sixteen hours at 500° C. Before treatment, the reverse current densities at −10 volts averaged 43 ma./cm.$^2$. After treatment this average was 8 ma./cm.$^2$. The light effect increased correspondingly from 40 percent to 530 percent for the average.

In another case, a PN junction was produced by diffusing zinc vapor into 0.5 ohm cm. N type germanium for twenty-two and one-half hours at 840° C. A PN junction diode was prepared and found to have a dark current of 0.25 ma. at −10 volts with a soft Zener breakdown at approximately −40 volts. At −38 volts for example a current of 40 ma. was registered. After treatment by means of a gold plating on the surface of the diode to a thickness of approximately 0.05 mil, heating at 700° C. for forty-five minutes and etching to remove the gold alloy with the etchant given above the electrical properties were again measured. A current 0.02 ma. was observed at −10 volts and one of 1.0 ma. at −38 volts. The Zener break occurred at −38.5 volts and was sharp in contrast to the untreated diode.

A slice of P type silicon, 3–4 ohm cm., was heated eighteen hours at 1220° C. in the presence of phosphorus vapor to give a PN junction approximately 0.5 mil from one surface. A diode cut from this junction was tested and then electroplated with approximately 0.05 mil thickness of gold and heat treated in helium at 860° C. for three minutes. After etching so as just to remove the fused gold layer an improvement in dark saturation current at −50 volts of from 10.0 ma. to 0.150 ma. was observed. After a second such treatment the current was down to 0.070 ma. The area of this junction was approximately 0.02 cm.$^2$. Before treatment a soft Zener voltage was observed in the vicinity of 50 volts. After treatment, a sharper Zener break was observed at about 100 volts.

The improvements in performance characteristics, indicated by the examples described above, are in part associated with or have associated therewith an increase in the carrier lifetimes for the semiconductive material and, further, may be realized concomitantly with control of the resistivity. This is illustrated by the following example: a single crystal germanium body of N conductivity type, having a resistivity of 16.2 ohm cm. and a carrier lifetime of 375 microseconds was converted to P type by immersing it for two minutes in a 0.5 percent solution of copper sulphate and then heating for one hour at 750° C. The resistivity of the P type body was 0.79 ohm cm. and the lifetime was less than five microseconds. Then the body was plated on all surfaces, as indicated below, heated for one-half hour in helium at 750° C., the surfaces cleaned and the lifetime and resistivity measured. This treatment was repeated several times, i. e. after each measurement, the body was replated and heated for a half hour in helium, at 750° C. The effect of the treatments is indicated in the following table:

| No. | Plating | Restivity in ohm cm. | Lifetime in Microseconds |
|---|---|---|---|
| 1 | Gold | 14.7 P type | 30 |
| 2 | Silver | 26.4 P type | 70 |
| 3 | do | 30.4 P type | 90 |
| 4 | do | 42.0 P type | 120 |
| 5 | do | 39.4 N type | 145 |

It will be noted that the carrier lifetime increased tremendously, specifically from less than five microseconds to one hundred forty-five microseconds, and the resistivity also increased from 0.79 ohm cm. P type to about 40 ohm cm. N type.

In another example, a P type specimen of germanium produced by doping with gallium to a resistivity of 11.0 ohm cm. was found to have a lifetime of 225 microseconds. After treatment in a 0.5 percent copper nitrate solution and heating at 804° C. for five minutes the lifetime was less than one microsecond. After electroplating with gold to a layer thickness of approximately 0.1 mil, the specimen was heated for five minutes at 800° C. After removal of the fused gold alloy by etching, the above treatment was repeated except that heating was at 550° C. for twenty and three-quarter hours. After finally etching off the gold alloy layer, the lifetime was now found to be between 400 to 415 microseconds which was higher than that of the original body.

Although several specific embodiments of the invention have been described, it will be understood that they are but illustrative and that various modifications may be made therein without departing from the scope and spirit of this invention.

What is claimed is:

1. The method of fabricating a germanium body for signal translating devices which comprises diffusing zinc into a body of N conductivity type germanium, thereby to form a PN junction in said body, coating the entire surface of said body with gold, and heating the coated body at a temperature of at least about 500° C. and below that at which significant rediffusion and change in the concentration gradient perpendicular to said junction occurs.

2. The method of reducing the contaminating impurity content of a semiconductive body selected from the group consisting of germanium and silicon, said body having a PN junction therein, which comprises applying to the surfaces of said body a coating of a metal for which the molecules of said contaminating impurities have a substantially greater affinity than said molecules have for said semiconductive material, said metal having an alloying temperature with the semiconductive material lower than the melting point of the semiconductive material and having a diffusion constant of less than $10^{-8}$ cm.$^2$ per second at about 850° C. when the body is germanium and of less than $10^{-10}$ cm.$^2$ at 1,000° C. when the body is silicon, and heating said body of at least about 500° C. and at a temperature below that at which significant rediffusion and change in the concentration gradient perpendicular to said junction occurs.

3. The method of reducing the copper content of a germanium semiconductive body having a PN junction therein, said body containing copper as a contaminating impurity, which comprises applying to the surfaces of said body a coating of a metal selected from the group consisting of antimony, gold, silver, tin, and zinc, heating said body at a temperature of at least about 500° C. and below that at which significant rediffusion and change in the concentration gradient perpendicular to said junction occurs, thereby to diffuse a portion of said copper content from said germanium to said coating, and then removing the coating and the copper therein.

4. The method of fabricating a germanium body for signal translating devices, said body originally containing contaminating impurities, which comprises diffusing into a body of germanium of one conductivity type a significant impurity characteristic of the opposite conductivity type, thereby to convert a portion of said body to said opposite conductivity type, coating all exposed surfaces of said body with a metal capable of alloying with germanium at a temperature below the melting point of germanium, essentially free of copper and having a diffusion constant in germanium of less than $10^{-8}$ cm.$^2$ per second at about 850° C., and with which said contaminating impurities have a greater tendency to alloy than with said body of germanium, and heating the coated body at a temperature of at least about 500° C. and below that at which significant rediffusion and change in the concentration gradient occurs to cause the movement of said contaminating impurity molecules from said body to said coating, and then removing said coating and the copper therein.

5. The method in accordance with claim 4 wherein said metal is selected from the group consisting of gold, silver, tin, zinc and antimony.

References Cited in the file of this patent

UNITED STATES PATENTS 2,597,028 Pfann ---------------- May 20, 1952